(12) United States Patent
Raaijmakers

(10) Patent No.: US 11,143,677 B2
(45) Date of Patent: Oct. 12, 2021

(54) DC METERING DEVICE AND METHOD

(71) Applicant: ABB Schweiz AG, Baden (CH)

(72) Inventor: Stefan Raaijmakers, Delft (NL)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 17/156,657

(22) Filed: Jan. 25, 2021

(65) Prior Publication Data

US 2021/0148954 A1 May 20, 2021

Related U.S. Application Data

(63) Continuation of application No. PCT/EP2019/070173, filed on Jul. 26, 2019.

(30) Foreign Application Priority Data

Jul. 26, 2018 (EP) .................................... 18185734

(51) Int. Cl.
| | |
|---|---|
| *G01R 15/20* | (2006.01) |
| *B60L 53/10* | (2019.01) |
| *B60L 53/66* | (2019.01) |
| *B60L 53/16* | (2019.01) |
| *G01R 33/00* | (2006.01) |

(52) U.S. Cl.
CPC ............ *G01R 15/202* (2013.01); *B60L 53/11* (2019.02); *B60L 53/16* (2019.02); *B60L 53/665* (2019.02); *G01R 33/0017* (2013.01)

(58) Field of Classification Search
CPC ......... B60L 53/11; B60L 53/665; B60L 53/16
See application file for complete search history.

(56) References Cited

U.S. PATENT DOCUMENTS

| | | | |
|---|---|---|---|
| 4,179,649 A | 12/1979 | Comiskey et al. | |
| 4,266,189 A * | 5/1981 | Karlin ..................... | H01F 38/30 |
| | | | 324/117 H |
| 2011/0238341 A1* | 9/2011 | Etezadi-Amoli ...... | B82Y 30/00 |
| | | | 702/61 |
| 2013/0346010 A1* | 12/2013 | Schulz .................. | B60L 3/0069 |
| | | | 702/122 |
| 2015/0160298 A1 | 6/2015 | Tabatowski-Bush | |
| 2015/0346288 A1* | 12/2015 | Hardy ..................... | B60L 53/63 |
| | | | 702/58 |

* cited by examiner

*Primary Examiner* — Alvaro E Fortich
(74) *Attorney, Agent, or Firm* — Leydig, Voit & Mayer, Ltd.

(57) ABSTRACT

A DC metering device includes: two current transducers comprising hall sensors for measuring direct currents; two electrical switches; and a control device. Each one current transducer and one switch are connected in series by series connections. The series connections of the current transducers and switches are connected in parallel. The control device switches off in a repeating sequence alternately one of the switches and to continuously calculate a sum of continuously measured direct currents subtracted by measured zero offset currents of the two current transducers. The zero offset currents are measured when no current goes through the current transducers.

19 Claims, 4 Drawing Sheets

DC METERING DEVICE AND METHOD

CROSS-REFERENCE TO PRIOR APPLICATION

This application is a continuation of International Patent Application No. PCT/EP2019/070173, filed on Jul. 26, 2019, which claims priority to European Patent Application No. EP 18185734.3, filed on Jul. 26, 2018. The entire disclosure of both applications is hereby incorporated by reference herein.

FIELD

The invention relates to a direct current, DC, metering device, comprising two current transducers configured for measuring direct currents, two electrical switches and a control device. The invention further relates to a method for determining a direct current, comprising two current transducers configured for measuring direct currents and two electrical switches.

BACKGROUND

Electric vehicle, EV, direct current, DC, fast charging methods and systems often use a so called Combined Charging System, CCS, protocol according to IEC 61851-23 and SAE J1772 standard for charging electrical vehicles both in the US and in the European Union, EU. As charge currents increase, liquid cooled charge cables for connecting an Electric Vehicle Supply Equipment, EVSE, via a charge connector with the electrical vehicle are becoming more commonly used. The liquid cooling allows conductors within the charge cable to become thinner, and thereby less stiff and easier to use, because excessive heat due to high charge currents and charge cable internal resistances is taken care of However, such cooling increases energy losses in the charge cable.

In recent days precise energy metering for DC EV charging has become a requirement in many countries. For instance, Germany already requires such precise metering, as defined by the REA 6A specification, while the US has similar requirements defined by the expected NIST hb44 update. According to these requirements, a measurement accuracy of 1% for the US and 3.5% for Germany has to be achieved of the electrical power delivered at the charging connector. Besides that precise energy metering is generally very important as operators of EV SEs want to sell electrical energy per kWh.

The requirements for energy metering are very strict. A DC metering device may not dissipate a lot of energy in its measurements or overall as defined in IEC 62053-41 DRAFT IEC:2017. Thus, even at low currents the accuracy of the DC metering device has to be very good. However, because of low dissipation, using a standard shunt will not be possible for metering currents, as such prior art standard shunts not seldom dissipate 37.5 W at 500 A. Using hall effect sensors may solve said problem, but have a lot of drift while accurate model are very expensive.

SUMMARY

In an embodiment, the present invention provides a DC metering device, comprising: two current transducers comprising hall sensors configured to measure direct currents; two electrical switches; and a control device, wherein each one current transducer and one switch are connected in series by series connections, wherein the series connections of the current transducers and switches are connected in parallel, wherein the control device is configured to switch off in a repeating sequence alternately one of the switches and to continuously calculate a sum of continuously measured direct currents subtracted by measured zero offset currents of the two current transducers, and wherein the zero offset currents are measured when no current goes through the current transducers.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
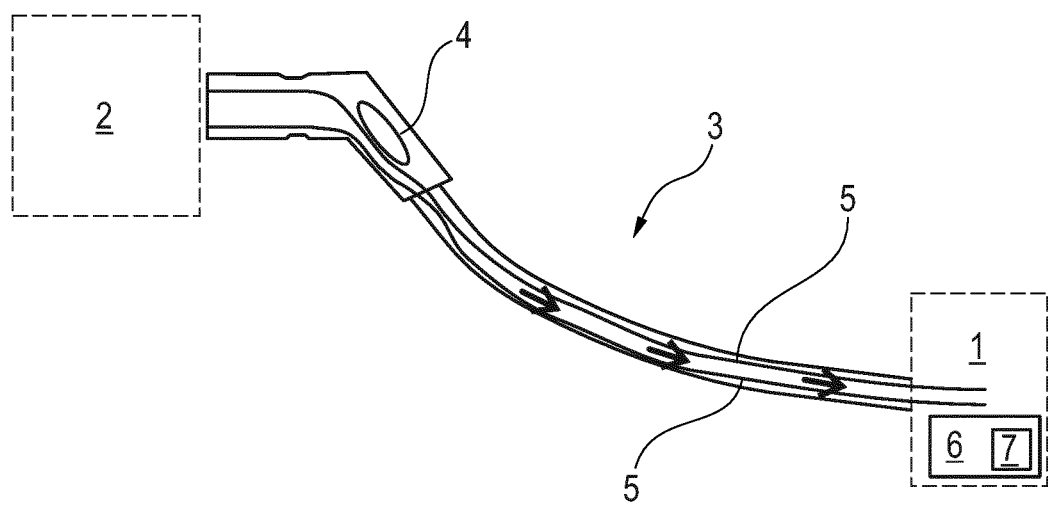
FIG. 1 shows an electric vehicle charging equipment, EVSE, with a DC metering device according to a preferred embodiment of the invention in a schematic view.

In an embodiment, the present invention provides a DC metering device and a respective method for accurately metering direct currents at low device costs, in particular in relation to EV fast charging.

In an embodiment, the present invention provides a direct current, DC, metering device, comprising two current transducers configured for measuring direct currents, two electrical switches and a control device, whereby each one current transducer and one switch are connected in series, the series connections of the current transducers and switches are connected in parallel, and the control device is configured for switching off in a repeating sequence alternately one of the switches and for continuously calculating a sum of continuously measured direct currents subtracted by the preferably alternately measured zero offset currents of the two current transducers.

In an embodiment, the present invention provides a method for determining a direct current, comprising two current transducers configured for measuring direct currents and two electrical switches, whereby each one current transducer and one switch are connected in series, the series connections of the current transducers and switches are connected in parallel, and the method comprises the steps of switching off in a repeating sequence alternately one of the switches and continuously calculating a sum of continuously measured direct currents subtracted by the preferably alternately measured zero offset currents of the two current transducers.

It is therefore a key point of the invention that the switches are by default both preferably always switched on and every now and then one of the switches is switched off, whereby the other switch remains on. The off time is kept to a minimal so that most of the time the losses are distributed. If no current goes to the switch that is switched off the zero offset current of the respective switch can be measured and respectively compensated by calculating said sum. Thereby, the proposed DC metering device respectively the method allows for using "inaccurate" cheap current transducers which are regularly characterized by a lot of drift, while providing two of such current transducers in parallel and switching off said current transducers via the switches in a repeating alternately sequence advantageously allows for compensating said drift and thus provide a very accurate and overall cheap measurement of the current, while not unnecessary dissipating energy for the measurements. The term continuously means that measurements for a respective current transducer are conducted even when the respective switch is switched off for measuring and subsequently compensating the zero offset current. Thereby, the zero offset currents of the two current transducers are preferably both measured respectively sampled if one of the switches is open for the respective current transducer.

According to a preferred implementation the repeating sequence comprises, starting with both switches switched on, switching off the first switch for one second, switching on the first switch and keeping both switches switched on for one second, switching off the second switch for one second, switching on the second switch and keeping both switches switched on for one second. Alternatively, the on-time of the switches can be two, three, five or more seconds. The switches can be implemented as MOSFETs, as contactors, as IGBTs or other switching devices.

In another preferred implementation the DC metering device or the method comprises two averaging resistors and two averaging capacitors, whereby each one averaging resistor and each one averaging capacitor are arranged in series thereby configured for averaging one of the measured zero offset currents. According to a further preferred implementation the DC metering device or the method comprises two electrical averaging switches each connected in-between the series connection of the averaging resistors and the averaging capacitors and the respective current transducers. Said averaging resistors, averaging capacitors and/or averaging switches advantageously allows averaging the current measurements for getting an accurate measurement of the zero offset currents.

In another preferred implementation the DC metering device or the method comprises a voltage prevention diode arranged in parallel to the series connections of the current transducers and switches or comprises two voltage prevention diodes each arranged in parallel to one of the switches. Such voltage prevention diode allows preventing a large, possibly destroying voltage on the switches. Further, such voltage prevention diode advantageously allows using low voltage low Ron MOSFETs as switches.

According to a further preferred implementation the current transducers each comprise a voltage output representing the measured current respectively the respectively the zero offset currents in relation to an internal resistance of the current transducers.

In another preferred implementation the current transducers are provided as hall sensors. Preferably, the hall sensors are provided as commercially available current transducer model LAH 100-P of manufacturer Farnell. The LAH 100-P is a closed loop (compensated) current transducer with isolated plastic case construction. The LAH series current transducer features as an electronic measurement of currents DC, AC, pulsed, mixed with a galvanic isolation between the primary circuit (high power) and the secondary circuit (electronic circuit).

In another preferred implementation the DC metering device or the method comprises a bleeder resistor arranged between an electrical energy source and the switches and/or comprising two bleeder resistors each arranged between the electrical energy source and one of the switches. In absence of an auxiliary supply in particular gates of the switches provided as MOSFETs can be advantageously fed through such bleeder resistor to switch on said switches. Alternatively or in addition, the switches can be switched on through associated bleeder resistors. The bleeder resistors may comprise a resistance of 100 kΩ or 1 MΩ.

In a further preferred implementation the DC metering device or the method comprises an auxiliary supply configured for providing an auxiliary energy for switching the switches. The auxiliary supply preferably provides a voltage of 15 V DC.

In another preferred implementation the DC metering device or the method comprises two optocouplers configured for switching the switches. Such optocouplers advantageously facilitate the switching off of the switches over an isolation barrier. Such way a gate-driver for the switches in particular provided as MOSFETs can be omitted as transitions of the switches i.e. switching off and on, are not required often for providing above discussed advantageous functionality. The transitions can be relatively slow as to reduce electromagnetic compatibility, EMC, and current measurement disturbances.

In a further preferred implementation of the DC metering device or of the method the control device is configured for respectively the method comprises the step of applying a reference current to at least one of the switches for calibrating the zero offset current of the respective switch. For example, during such offset calibration the reference current can be applied to one switch for a short period of time to test and compensate for gain errors. For instance, if the first switch is switched off, first the offset is calibrated while a current of 0 A is flowing through the current transducer. Subsequently the reference current is applied to calibrate gain errors. Afterwards, the first switch is closed again and current is shared between the current transducers. The second switch can be calibrated in an analogous manner.

In another preferred implementation the DC metering device or the method comprises two temperature sensors associated to the current transducers for compensating temperature dependent errors. Such temperature sensors allow for advantageously compensating temperature dependent linearity and/or gain errors of the current transducers. Thereby, characteristics of the current transducer can be determined and a lookup-table based compensation table or curve fitted polynomial equation can be used to compensate for said linearity and gain errors.

According to a further preferred implementation of the DC metering device or of the method the control device is configured for respectively the method comprises the step of, when switching off one of the switches, determining if a jump in the measured current above a predefined threshold occurs. Such jump indicates that there is a gain error in one of the current transducers. Thus, such implementation provides a 'sanity check' to see if the current transducers are fully operational.

The object of the invention is further solved by an electric vehicle charging equipment, EVSE, configured for delivering electrical energy to an electrical vehicle, comprising the DC metering device or configured for executing the method as described before. Generally, the EVSE, electric vehicle supply equipment, also referred to as electric vehicle charging station, EV charging station, electric recharging point, charging point and charge point, is an element in an infrastructure that supplies electric energy for the recharging of electric vehicles, such as plug-in electric vehicles, including electric cars, neighbourhood electric vehicles and plug-in hybrids. The EVSE is preferably configured for charging the electrical vehicle by using a Combined Charging System, CCS, protocol according to IEC 61851-23 and/or SAE J1772 standard and/or whereby the charging connectors and/or the charging cables are provided according to IEC 62196 standard. The EVSE is applicable to different type of electrical vehicles, including for examples electrical busses. Preferably, the EVSE is configured for charging the electrical vehicle with a DC input voltage up to 1500 V DC.

In a further preferred implementation the EVSE comprises a charge cable with a charge connector for connecting to the electrical vehicle, whereby the current transducers are arranged within the charge connector. Thus, in other words, the current transducers are arranged, for example, within an enclosure of the charge connector thereby ensuring that the actual current actually supplied to the electrical vehicle is measured. The charge cables are preferably liquid cooled. The charge connector may comprise contact pins for electrically contacting the electrical vehicle. The charge connector can be a combination of an AC connector with a DC option and is called in such case Combo Coupler, while variant with IEC Type 2 is often abbreviated as Combo2. The charge connector is also referred to as electrical connector or coupler.

The DC charge cable may comprise further conductors, such as, for example, a Proximity Pilot, PP, line for a PP signal, a Control Pilot, CP, line for a CP signal line and/or a PE line for a PE signal. PP line, CP line and/or PE line and respectively signalling are preferably implemented according to the so called Combined Charging System, CCS, protocol, in particular according to IEC 61851 or IEC 61851-23 standard. The Combined Charging System, CCS, protocol is a fast charging method for charging electric vehicles delivering high-voltage direct current via a charging connector derived from SAE J1772 standard (IEC Type 1) or IEC Type 2 connector. Automobile manufactures that support CCS include Jaguar, Volkswagen, General Motors, BMW, Daimler, Ford, FCA, Tesla and Hyundai. The CSS standard is controlled by the so called CharIN consortium. Besides other protocols such as, for example, CHAdeMO, as abbreviation of CHArge de Move, or GB/T, in particular according to 20234.3-2011 standard, can also be used with the described EVSE respectively the method.

In another preferred implementation of the EVSE, DC conductors of the charge cable comprise a diameter of $\geq 25$ mm$^2$, 50 mm$^2$ or 70 mm$^2$, the signal lines comprise a diameter of $\leq 0.5$ mm$^2$, 0.75 mm$^2$ or 1 mm$^2$ and/or the charging cables and/or the signal lines comprises a length of $\geq 4$ m, 5 m or 7.5 m and $\leq 5$ m, 7.5 m or 10 m. For cooling the DC conductors respectively the charge cable, a cooling device can be provided, which is preferably arranged at the EVSE and/or which is configured that a cooling fluid is conveyed from a first end to a second, opposite end of the DC charging cable respectively of the DC conductors, and thereafter from the second end to the first end. The DC charge cable may comprise additional DC conductors i.e. more than two DC conductors, which could be equipped with a respective signal line.

FIG. 1 shows an electric vehicle charging equipment, EVSE, 1 for charging an electrical vehicle 2 with a direct current, DC, charge current. The EVSE 1 comprises a liquid cooled charge cable 3 with a respective charge connector 4 connected thereto. The liquid cooled charge cable 3 is cooled by a non-electrically conductive oil-based coolant, which is in contact with copper conductors 5 of the charge cable 3. The charge cable 3 and the charge connector 4 are provided according to IEC 62196 standard, while the EVSE 1 is configured for charging the electrical vehicle 2 by using a Combined Charging System, CCS, protocol according to IEC 61851-23 and SAE J1772 standard.

Figure 2:
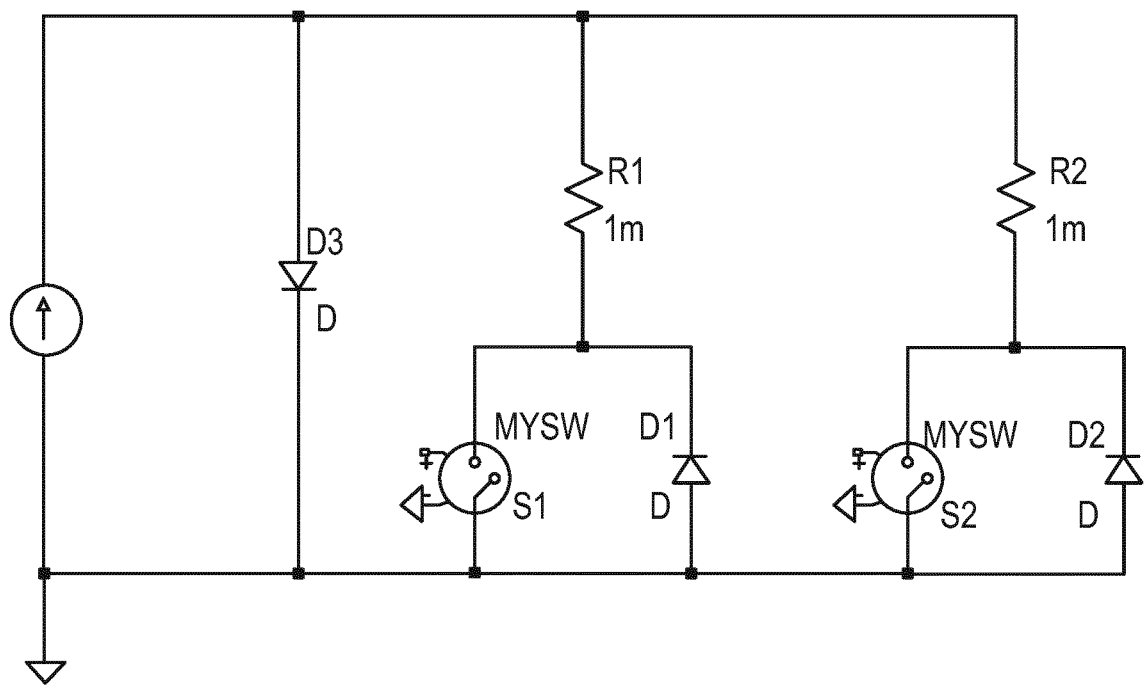
FIG. 2 shows a simplified circuit diagram of the DC metering device according to the preferred embodiment of the invention.
Figure 3:
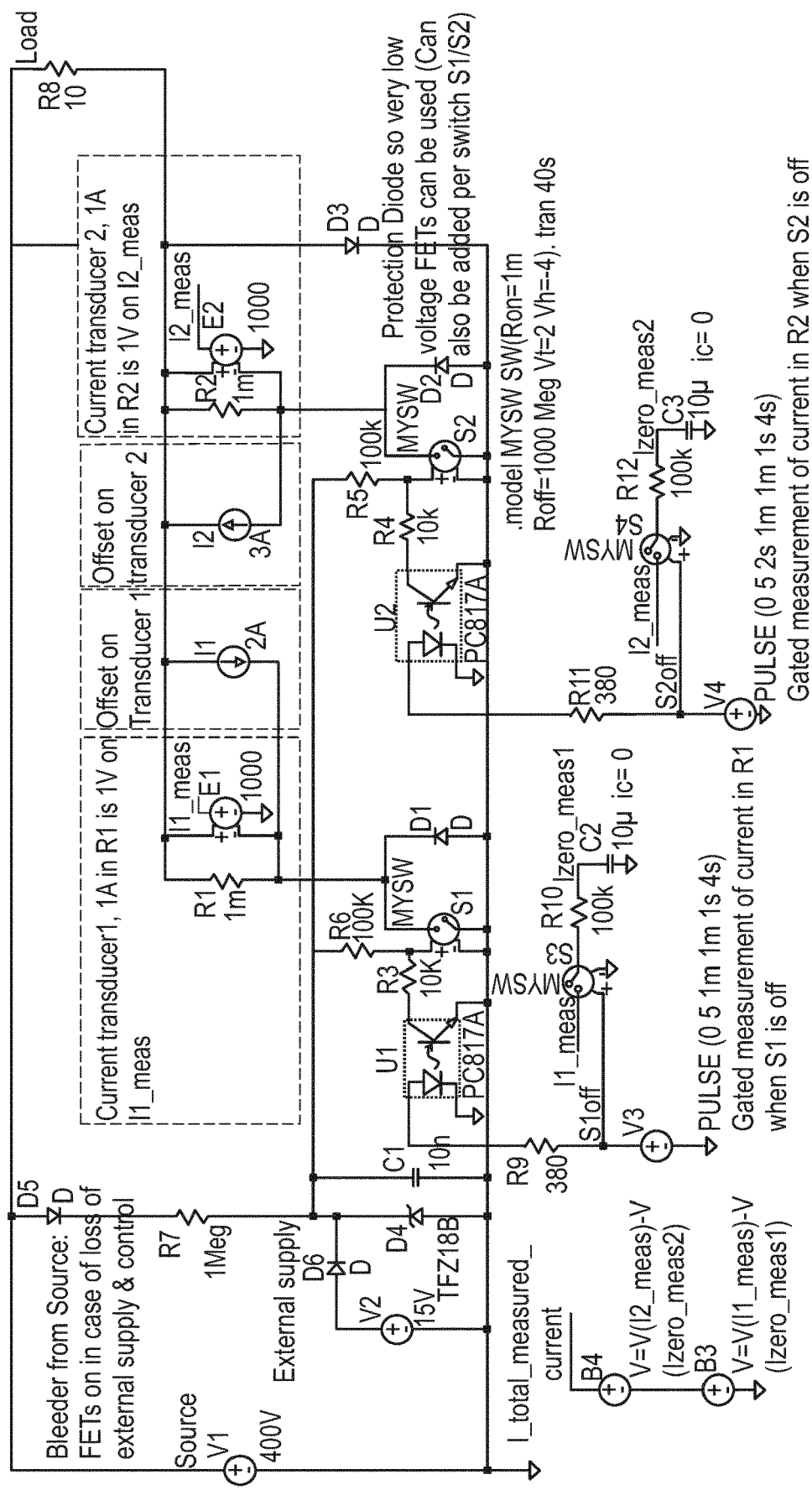
FIG. 3 shows a detailed circuit diagram of the DC metering device according to the preferred embodiment of the invention.
Figure 4:
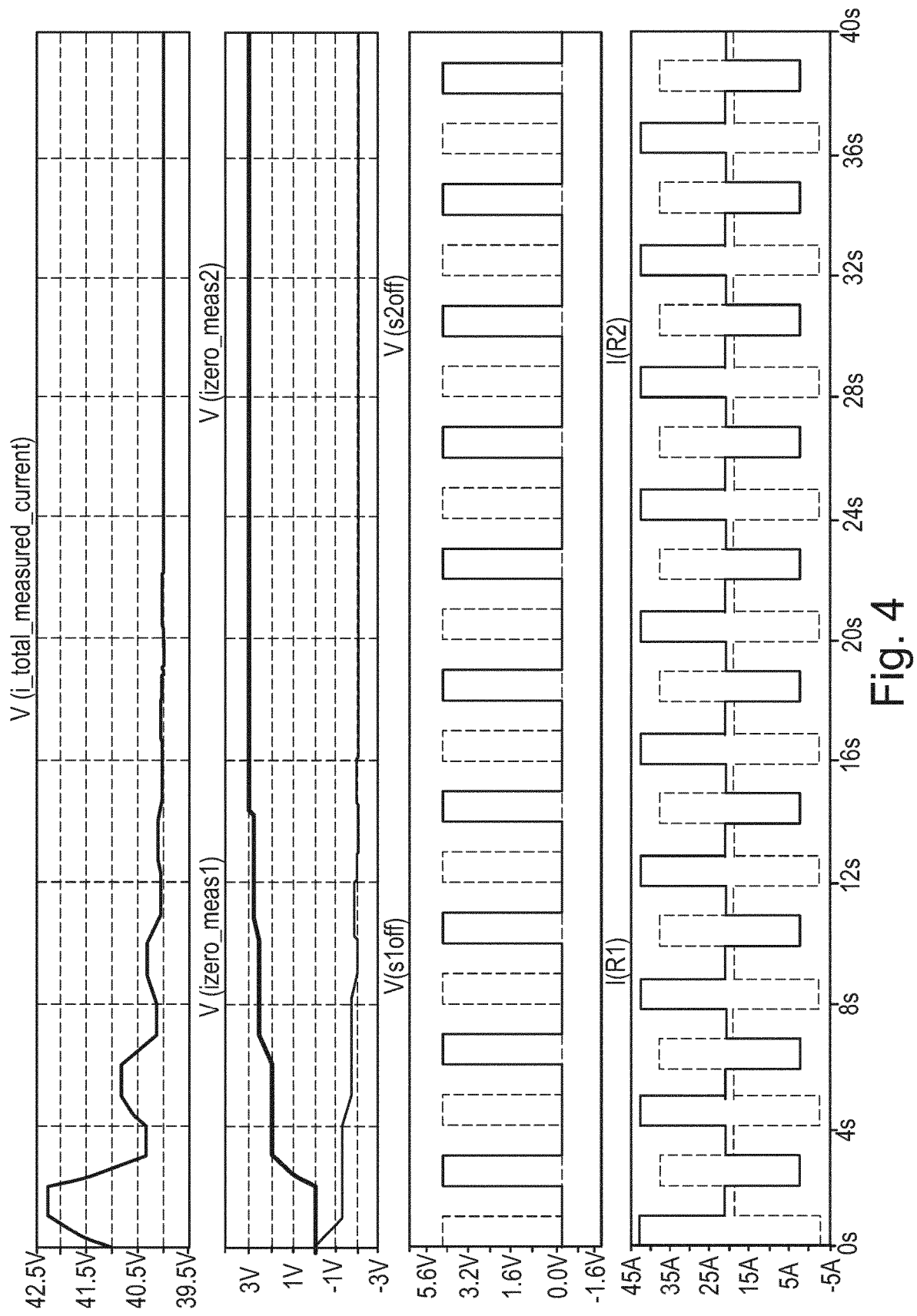
FIG. 4 shows simulated current measurements by using the DC metering device according to the preferred embodiment of the invention.

The EVSE 1 comprises a DC metering device 6, which is schematically depicted in FIG. 1. FIG. 2 show a simplified circuit diagram of the DC metering device 6, while FIG. 3 shows a detailed circuit diagram of the DC metering device 6. FIG. 4 shows simulated current measurements by using the DC metering device.

As can be seen in particular from FIG. 3, the DC metering device 6 comprises two current transducers R1, I1, R2, I2 each provided as hall sensors, which are arranged in the DC path 13 towards the electrical vehicle 2. The current transducers R1, I1, R2, I2 can be provided within an EVSE 1 enclosure or within the charge connector 4 thereby distant to the EVSE 1 enclosure. The DC metering device further comprises two electrical switches S1, S2, which are provided as MOSFETs, contactors, IGBTs or other switching devices. Each one current transducer R1, I1, R2, I2 and one switch S1, S2 are connected in series. The series connections of the current transducers R1, I1, R2, I2 and switches S1, S2 are connected in parallel and thereby within the DC path 13.

The DC metering device 6 further comprises a computerized control device 7, which is configured for switching off in a repeating sequence alternately one of the switches S1, S2. Specifically, the control device 7 switches both switches S1, S2 starting with both switches S1, S2 switched on in the repeating sequence: Switching off the first switch S1 for one second, switching on the first switch S1 and keeping both switches S1, S2 switched on for one second, switching off the second switch S2 for one second, switching on the second switch S2 and keeping both switches S1, S2 switched on for one second. Thereby, at each time at least one switch S1, S2 of the two switches S1, S2 is always switched on.

More specifically, by default S1 and S2 are always switched on. Every now and then, one of the switches S1, S2 is switched off. The off time is kept to a minimal so that most of the time respective losses are distributed. Referring in particular to FIG. 2, if the first switch S1 is switched off, all current will go through the second resistor R2, and none current through the first resistor R1. If the second switch S2 is switched off, all current will to through the first resistor R1, and none through the second resistor R2. When no current goes through the current transducers R1, I1, R2, I2, the offset current can be measured and compensated for, as described next.

In parallel thereto, the DC metering device 6 continuously calculates a sum Imeas of continuously measured direct currents I1, I2 subtracted by the alternately measured zero offset currents IzeroR1, IzeroR2 of the two current transducers R1, I1, R2, I2. Thus, the zero offset currents IzeroR1, IzeroR2 are alternately measured. The respective result is shown in FIG. 4. As can be seen from the fourth diagram at the bottom, after some initial measurements, with compensated drift, the sum Imeas is stable and thus provide an accurate value of the current with compensated offset. In other words, the summarized measured current Imeas is the sum of the current through R1, minus the zero offset of R1 i.e. IzeroR1 plus the current through R2, minus the zero offset of R2 i.e. IzeroR2, as represented by B3 and B4 in FIG. 3.

For averaging the current measurements, going now back to FIG. 3, the DC metering device 6 comprises two averaging resistors R10, R12 and two averaging capacitors C2, C3, which are each arranged in series. Such way zero offset currents IzeroR1, IzeroR2 measurements are averaged for receiving an accurate measurements of said zero offset currents IzeroR1, IzeroR2. The circuit further comprises two electrical averaging switches S3, S4, which each connected in-between the series connection of the averaging resistors R10, R12 and the averaging capacitors C2, C3 and the respective current transducers R1, I1, R2, I2 for gating the measured currents on resistors R1 and R2. The current transducers R1, I1, R2, I2 each comprise a voltage output, labelled as B1, B2 in FIG. 3, representing the measured current I1, I2 respectively the respectively the zero offset currents IzeroR1, IzeroR2 in relation to the internal resistance R1, R2 of the current transducers R1, I1, R2, I2.

For preventing a large voltage on switches S1 and S2, the circuit further comprises a voltage prevention diode D3 arranged in parallel to the series connections of the current transducers R1, I1, R2, I2 and switches S1, S2. In addition, for enabling use of low voltage Ron MOSFETs as switches S1, S2, the circuit comprises two voltage prevention diodes D1, D2, which are each arranged in parallel to one of the switches S1, S2. The gates of the MOSFETs S1, S2 are fed through a bleeder resistor R7 arranged between an electrical energy source V1 and the switches S1, S2, for switching on switches S1, S2 even in absence of an auxiliary supply V2.

Further bleeder resistors R6, R5 are arranged between the electrical energy source V1, such as a DC source, an AC grid connected via a rectifier or the like, and one of the switches S1, S2, for switching said switches S1, D2. For properly switching off the switches independent from the electrical energy source V1 if said source voltage is too low the auxiliary supply V2 is provided and configured for providing an auxiliary energy for switching the switches S1, S2. The circuit further comprises a preventing diode D4 for preventing the gate voltage of the switches S1, S2 from rising above an allowed value. Two optocouplers U1, U2 facilitate switching off the MOSFET switches S1, S2 over an isolation barrier. Thereby a gate driver can be avoided, as transitions of the switches S1, S2 i.e. switching the switches S1, S2 happens not very often, and can be relatively slow to reduce EMC and measurement disturbances.

For offset calibrating the current transducers R1, I1, R2, I2 a reference current can be applied for a short period of time to test and compensate for gain errors. For instance, if the first switch S1 is switched off, first the offset of the first current transducer R1, I1 is calibrated while 0 A is flowing through the first current transducer R1, I1. Subsequently a reference current is applied to calibrate gain errors of said first current transducer R1, I1. Afterwards, the first switch S1 is closed again and current is shared between the current transducers R1, I1, R2, I2. Thereby the zero offset current IzeroR1, IzeroR2 of the respective switch S1, S2 is calibrating.

In order to compensate for temperature dependent linearity and/or gain errors, the DC metering device 6 comprises two temperature sensors associated to the current transducers R1, I1, R2, I2. Characteristics of the current transducers R1, I1, R2, I2 can be determined and a lookup-table based compensation table. Alternatively or in addition, a curve fitted polynomial equation can be used to compensate for linearity and gain errors of the current transducers R1, I1, R2, I2.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

REFERENCE SIGNS LIST 1 electric vehicle charging equipment, EVSE
2 electrical vehicle
3 charge cable
4 charge connector
5 conductor
6 DC metering device
7 control device

What is claimed is:
1. A DC (direct current) metering device, comprising:
two current transducers comprising hall sensors configured to measure direct currents; two electrical switches; and
a control device,
wherein each one current transducer and one switch are connected in series by series connections, wherein the series connections of the current transducers and switches are connected in parallel, wherein the control device is configured to switch off in a repeating sequence alternately one of the switches and to continuously calculate a sum of continuously measured direct currents subtracted by measured zero offset currents of the two current transducers, and wherein the zero offset currents are measured when no current goes through the current transducers.

2. The DC metering device according to claim 1, wherein the repeating sequence comprises, starting with both switches switched on, switching off the first switch for one second, switching on the first switch and keeping both switches switched on for one second, switching off the second switch for one second, and switching on the second switch and keeping both switches switched on for one second.

3. The DC metering device according to claim 1, further comprising:
two averaging resistors; and
two averaging capacitors,
wherein each one averaging resistor and each one averaging capacitor are arranged in series by a series connection, and are thereby configured to average one of the measured zero offset currents.

4. The DC metering device according to claim 3, further comprising:
two electrical averaging switches each connected in between the series connection of the averaging resistors and the averaging capacitors and the respective current transducers.

5. The DC metering device according to claim 1, further comprising:
a voltage prevention diode arranged in parallel to the series connections of the current transducers and switches, or
two voltage prevention diodes each arranged in parallel to one of the switches.

6. The DC metering device according to claim 1, wherein the current transducers each comprise a voltage output representing the measured current respective of the zero offset currents in relation to an internal resistance of the current transducers.

7. The DC metering device according to claim 1, further comprising:
an electrical energy source; and
a bleeder resistor arranged between the electrical energy source and the switches and/or two bleeder resistors each arranged between the electrical energy source and one of the switches.

8. The DC metering device according to claim 1, further comprising:
an auxiliary supply configured to provide an auxiliary energy for switching the switches.

9. The DC metering device according to claim 1, further comprising:
two optocouplers configured to switch the switches.

10. The DC metering device according to claim 1, wherein the control device is configured to apply a reference current to at least one of the switches to calibrate the zero offset current of the respective switch.

11. The DC metering device according to claim 1, further comprising:
two temperature sensors associated with the current transducers and configured to compensate for temperature dependent errors.

12. An electric vehicle charging equipment (EVSE) configured to deliver electrical energy to an electrical vehicle, comprising:
the DC metering device according to claim 1.

13. The EVSE according to claim 12, further comprising:
a charge cable having a charge connector configured to connect to the electrical vehicle,
wherein the current transducers are arranged within the charge connector.

14. A method for determining a direct current, comprising:
providing two current transducers comprising hall sensors, the two current transducers being configured to measure direct currents and two electrical switches, each one current transducer and one switch being connected in series by series connection, the series connections of the current transducers and switches being connected in parallel;
switching off in a repeating sequence alternately one of the switches; and
continuously calculating a sum of continuously measured direct currents subtracted by the measured zero offset currents of the two current transducers, the zero offset currents being measured when no current goes through the current transducers.

15. The method according to claim 14, wherein the repeating sequence comprises, starting with both switches switched on, switching off the first switch for one second, switching on the first switch and keeping both switches switched on for one second, switching off the second switch for one second, and switching on the second switch and keeping both switches switched on for one second.

16. The method according to claim 14, further comprising:
providing two averaging resistors and two averaging capacitors, wherein each one averaging resistor and each one averaging capacitor are arranged in series so as to average one of the measured zero offset currents.

17. The method according to claim 16, further comprising:
providing two electrical averaging switches each connected in between a series connection of the averaging resistors and the averaging capacitors and the respective current transducers.

18. The method according to claim 14, further comprising:
arranging a voltage prevention diode in parallel to series connections of the current transducers and switches, or
arranging two voltage prevention diodes each in parallel to one of the switches.

19. The method according to claim 14, further comprising:
applying a reference current to at least one of the switches to calibrate the zero offset current of the respective switch.

* * * * *